United States Patent [19]

Pernyeszi

[11] Patent Number: 5,155,568
[45] Date of Patent: Oct. 13, 1992

[54] HIGH-VOLTAGE SEMICONDUCTOR DEVICE

[75] Inventor: Joseph Pernyeszi, Scotts Valley, Calif.

[73] Assignee: Hewlett-Packard Company, Palo Alto, Calif.

[21] Appl. No.: 338,871

[22] Filed: Apr. 14, 1989

[51] Int. Cl.$^5$ ............ H01L 29/06; H01L 29/78; H01L 29/74

[52] U.S. Cl. ............ 357/38; 357/23.11; 357/35; 357/51

[58] Field of Search ........... 357/35, 38, 23.11, 51

[56] References Cited

U.S. PATENT DOCUMENTS

| | | | |
|---|---|---|---|
| 3,246,172 | 4/1966 | Sanford | 307/88.5 |
| 3,485,781 | 5/1966 | Simon | 317/235 |
| 4,292,642 | 9/1981 | Appels et al. | 357/13 |
| 4,305,085 | 12/1981 | Jaecklin et al. | 357/52 |
| 4,494,134 | 1/1985 | Wildi et al. | 357/43 |
| 4,618,872 | 10/1986 | Baliga | 357/23.4 |
| 4,825,266 | 4/1989 | Whight | 357/13 |

OTHER PUBLICATIONS

Muller et al., *Device Electronics for IC'S*, pp. 193-199 1986.

*Primary Examiner*—Andrew J. James
*Assistant Examiner*—Stephen D. Meier

[57] ABSTRACT

A semiconductor-controlled rectifier provides an example of a semiconductor device having enhanced resistance to electrical breakdown upon application of high voltage in the forward blocking mode. Enhanced breakdown voltage of 20 percent or more is achieved by having one or more bands of relatively heavier doped semiconductor material within a lighter doped region between the electrical connections to the device. Such high conductivity regions provide termination of the electric field away from the location where electrical breakdown may commence, by shaping the electric field or the depletion region adjacent to the semiconductor junctions.

10 Claims, 4 Drawing Sheets

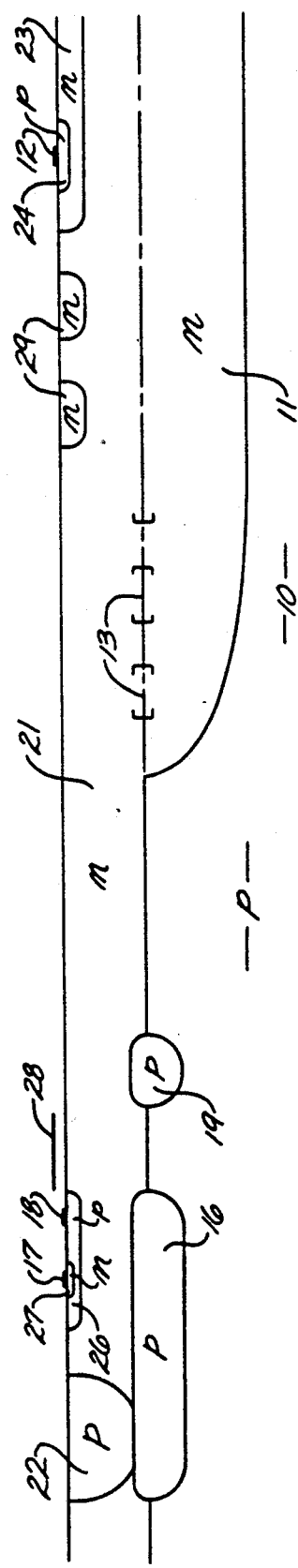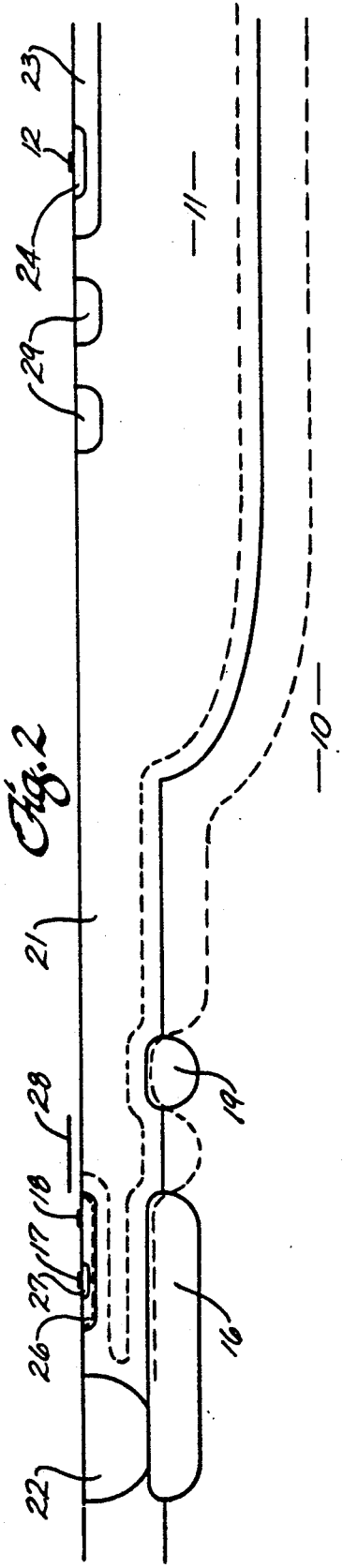

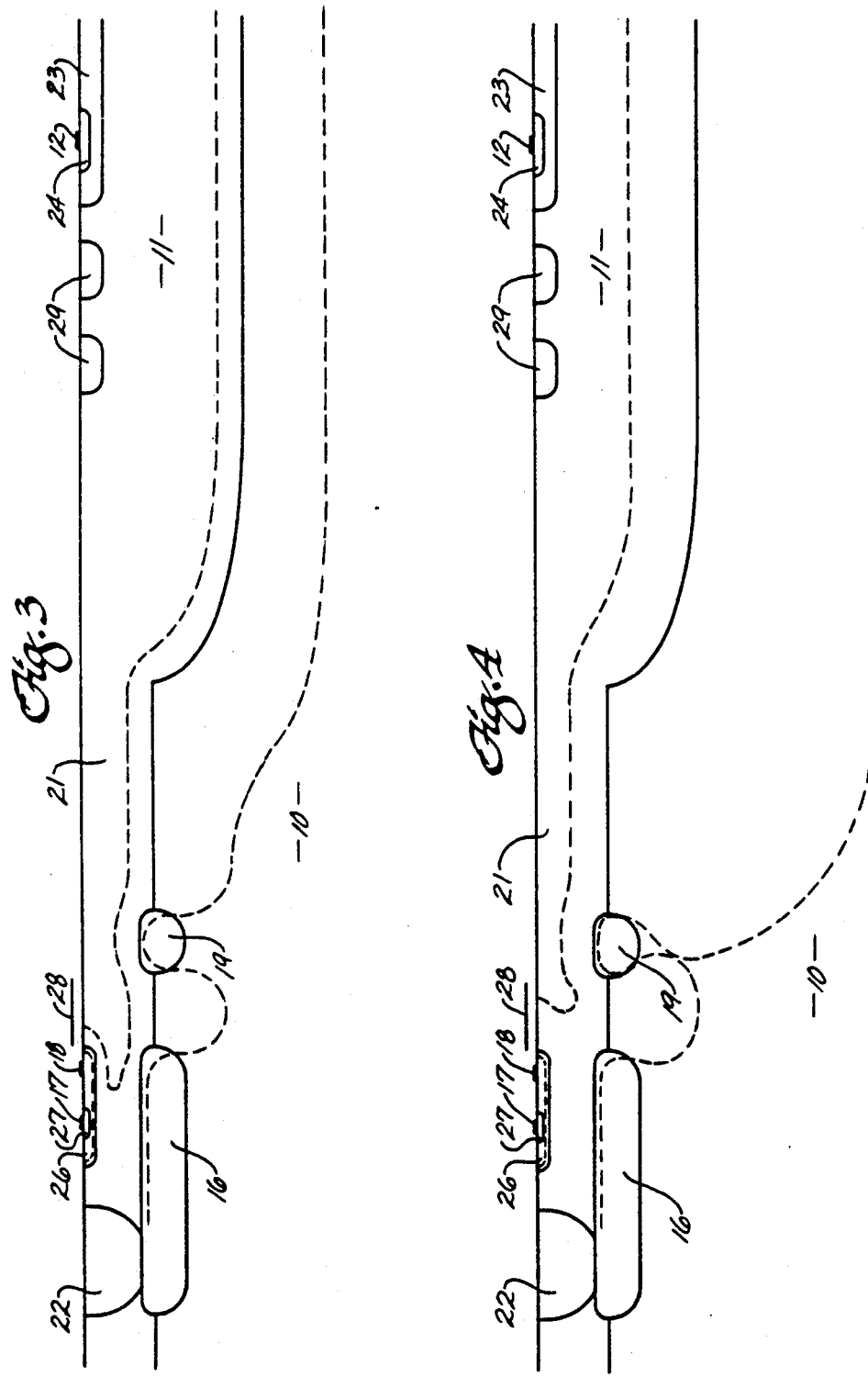

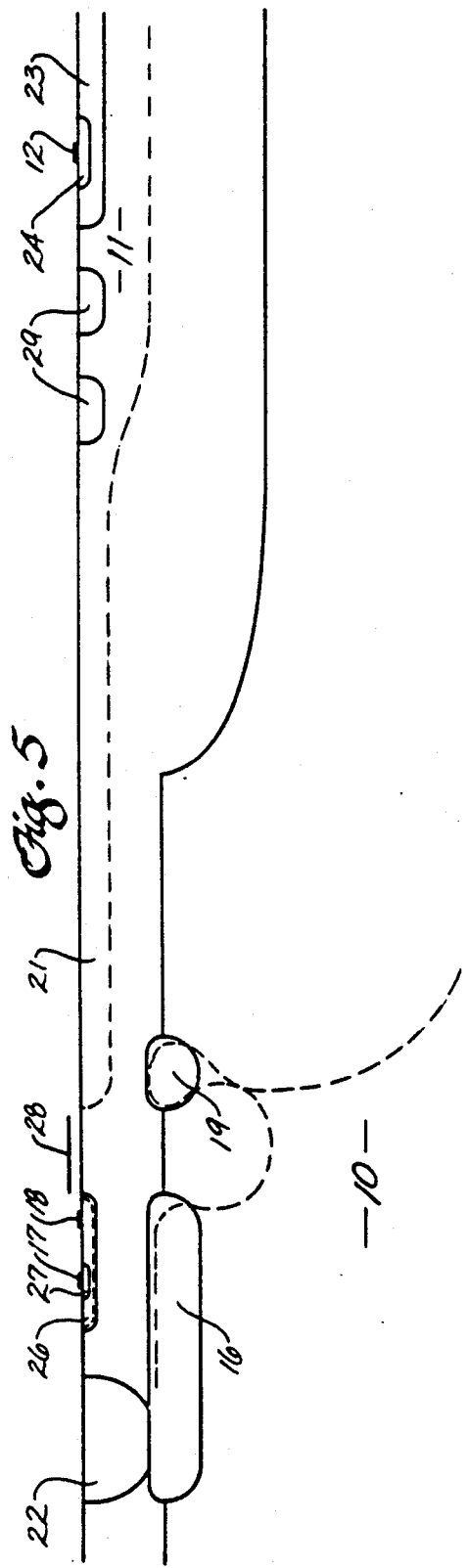
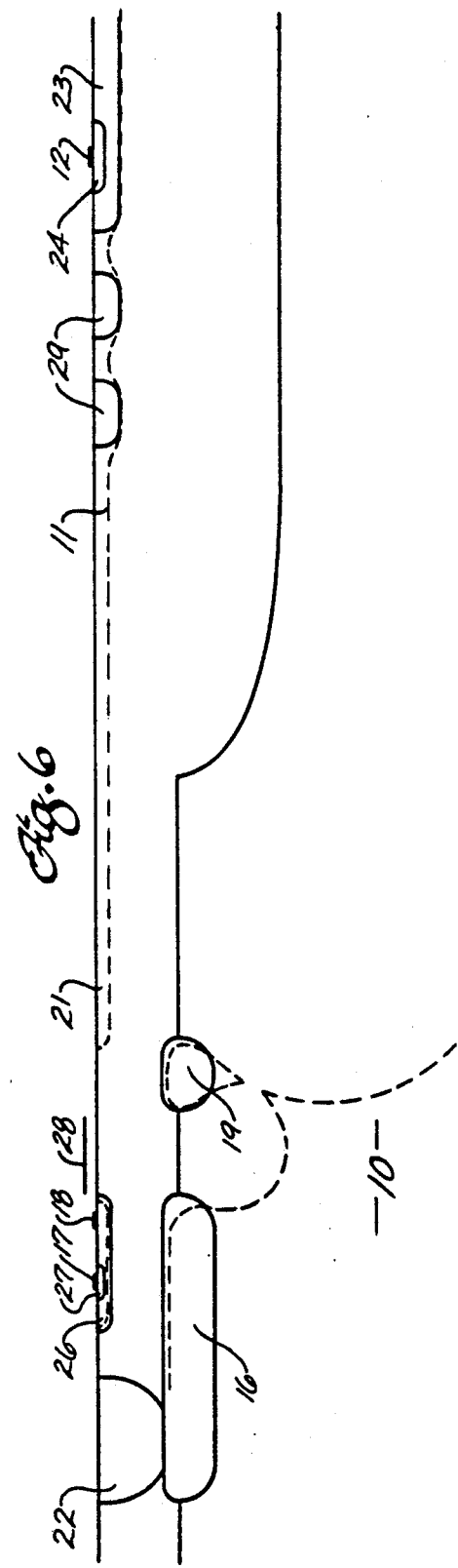

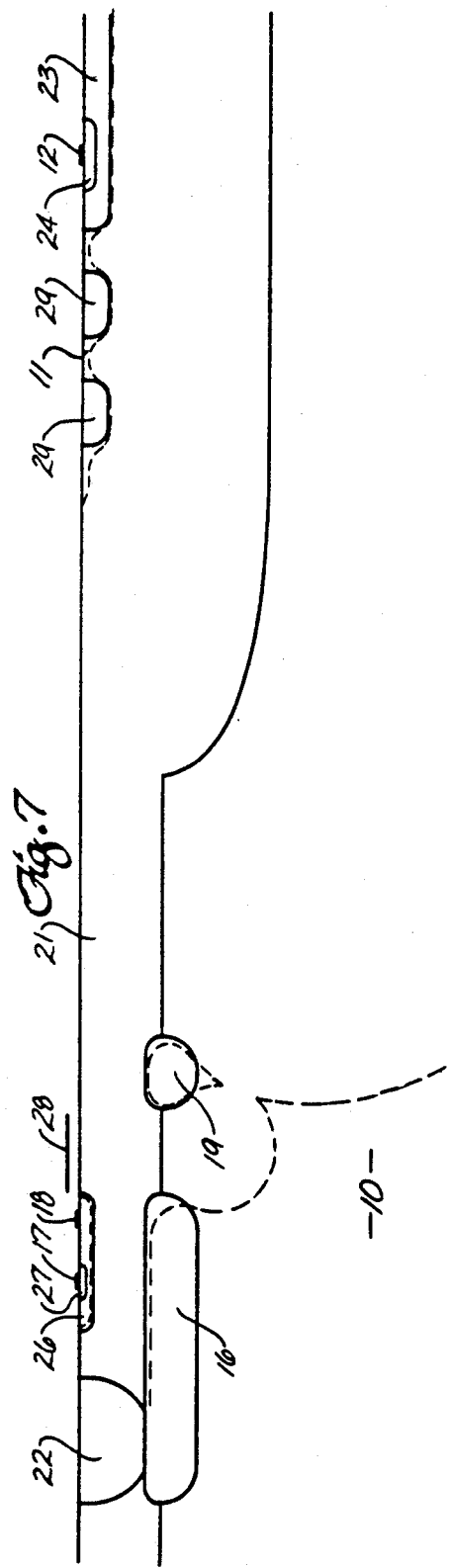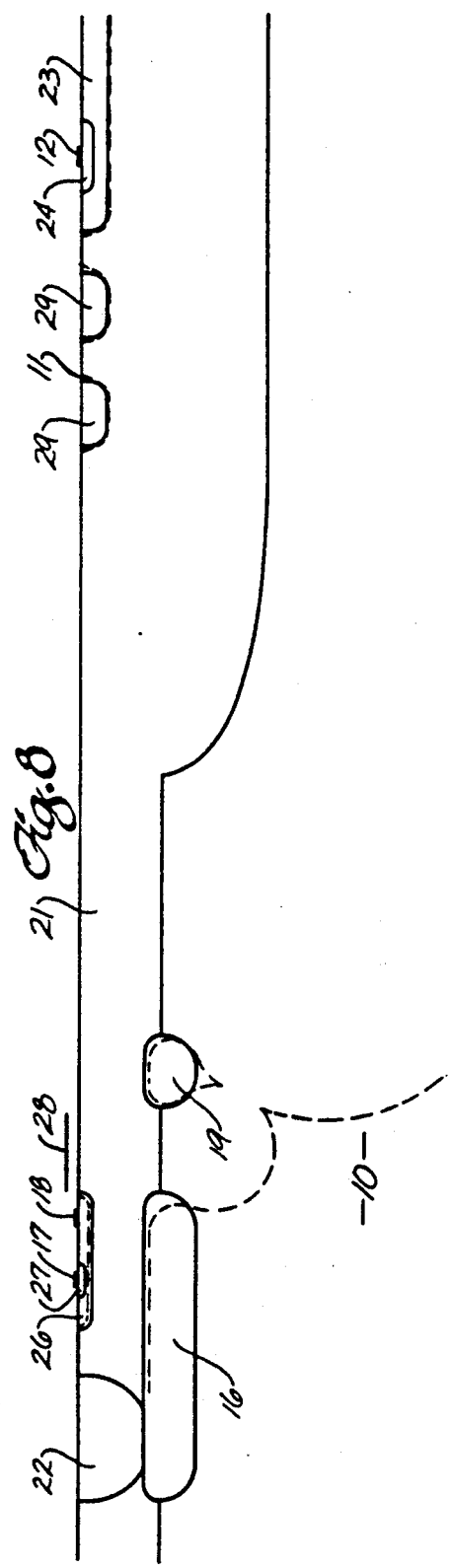

HIGH-VOLTAGE SEMICONDUCTOR DEVICE

FIELD OF THE INVENTION

This invention relates to techniques for increasing the reverse bias voltage at which a semiconductor device breaks down and becomes conductive. More specifically, an example provides electric field or depletion region shaping in a semiconductor-controlled rectifier wherein breakdown voltage can be increased in the order of 20 percent.

BACKGROUND

Silicon and other semiconductor devices are sometimes employed at sufficiently high voltages to precipitate a current avalanche and electrical breakdown of the device. Without adequate current limitations, such breakdown may lead to failure of the device. If nothing else, the breakdown may cause a failure of the circuit in which the device is employed, to perform as required. Thus, designers of semiconductor devices often need to design the device so that it can withstand high voltages without electrical breakdown. For example, it is desirable for the curvature of diffused junctions in the device to have as large a radius as possible, since short-radius junctions are subject to electrical breakdown at lower voltages than high-radius junctions.

Regardless, it remains desirable to provide additional means for deferring electrical breakdown to even higher voltages.

An example of a device often subjected to high voltages is a semiconductor-controlled rectifier (SCR), sometimes referred to as a silicon-controlled rectifier or thyristor. Various diodes, bipolar transistors, MOSFETs and the like may also have reverse voltage limitations which need to be taken into account. An SCR is typically in a circuit having an alternating current so that the gate of the SCR controls the proportion of each forward cycle of the alternating current that is conductive, while resisting all current flow during the reverse half of the cycle. The breakdown voltage of the SCR must be greater than the peak voltage of the alternating current in the circuit in which the SCR is used.

In an SCR, electrical breakdown can initiate adjacent to the gate at a relatively lower voltage or adjacent to the anode at a relatively higher voltage. It is desirable to provide means adjacent to the gate for shaping the depletion region, thereby minimizing electric field and avoiding low-voltage breakdown. The breakdown of the SCR can then be limited by the breakdown voltage adjacent to the anode. It is also desirable, however, to shape the depletion region and electric field adjacent to the anode so that electrical breakdown in that vicinity is also deferred to higher voltages.

BRIEF SUMMARY OF THE INVENTION

There is, therefore, provided in practice of this invention according to a presently preferred embodiment, a high-voltage semiconductor device having an anode and cathode with a relatively lighter doped region of semiconductor between the cathode and anode. Breakdown voltages are enhanced by providing a protective band of relatively higher doped semiconductor completely within the lighter doped region and having the same type of doping as the lighter doped region. This can restrict the approach of the depletion region to the anode, for example, and defer electrical breakdown to appreciably higher voltage than in absence of such a band.

In an exemplary embodiment a band of relatively higher doped n-type material may be formed in the relatively lighter doped n-type base adjacent to the anode of an SCR for terminating the electric field further from the anode. It may also be desirable to provide a p-type buried layer between the n-type base and the p-type substrate in an SCR in an area under the gate, plus a p-type barrier band between the n-type base and substrate between the p-type buried layer and the anode. This can help inhibit low-voltage breakdown adjacent to the gate.

BRIEF DESCRIPTION OF THE DRAWINGS

These and other features and advantages of the present invention will be appreciated as the same becomes better understood by reference to the following detailed description when considered in connection with the accompanying drawings, wherein:

FIG. 1 is a fragmentary, transverse, semi-schematic cross section of a semiconductor-controlled rectifier including features provided in practice of this invention;

FIG. 2 is a cross section similar to FIG. 1 indicating boundaries of a depletion region with a relatively low reverse voltage applied to the SCR;

FIG. 3 is a cross section similar to FIG. 2 at a higher voltage;

FIG. 4 is a view similar to FIG. 3 at a still higher voltage;

FIG. 5 is a view similar to FIG. 4 at a still higher voltage;

FIG. 6 is a view similar to FIG. 5 at a still higher voltage;

FIG. 7 is a view similar to FIG. 6 at a still higher voltage; and

FIG. 8 is a view similar to FIG. 7 at a still higher voltage.

DETAILED DESCRIPTION

The drawings represent a fragmentary transverse cross section of a semiconductor-controlled rectifier (SCR) typical of semiconductor devices incorporating principles of this invention. FIG. 1 illustrates structural features of the SCR and the balance of the drawings indicate most of those features plus an indication in dashed lines of the boundaries of a depletion region in the semiconductor at progressively higher voltages in the forward blocking mode. In the forward conduction state, the SCR operates in a conventional manner and no further description is required herein. The particular SCR described operates with an external diode (not shown) in series for reverse blocking.

The cross section illustrated in the drawings is through roughly one-half of the SCR structure, which is in the form of a plurality of concentric rings of doped regions. Thus, for example, the current carrying leads to the SCR comprise a relatively smaller diameter anode ring 12 concentric with a larger diameter cathode ring 17.

As used herein, the term "band" may be used to refer to the concentric rings, since such a circular structure is but one embodiment of a semiconductor device and such features may be in the form of side-by-side elements instead of being arranged in concentric rings.

The terms anode and cathode are used herein since they have conventional meanings for an SCR. Terms such as emitter and collector may be more appropriate for a bipolar transistor and such alternative terminology for similar functional features will be apparent to those skilled in the art.

It will also be recognized that the relative proportions and the shapes of the junctions in the device are somewhat schematic for purposes of illustration. No distinction is being made between abrupt junctions and graded junctions, although either or both may be present in an SCR or other semiconductor device. A few dimensions are included in the description where it may be of assistance in achieving an understanding of this invention. Other dimensions, doping materials and concentrations, manufacturing techniques and the like will be apparent to those skilled in the art.

The SCR is fabricated by conventional techniques of masking, deposition, diffusion and/or ion implantation of doping agents in or on a p-type substrate 10.

The first operation in construction of the SCR is formation of a diffused n-type buried layer 11 beneath the anode 12 of the SCR. The n-type buried layer is preferably doped with phosphorus, since it is diffused to a depth of about 20 to 25 micrometers into the substrate.

The edge of the n-type buried layer 11 could produce geometrical field enhancement which would adversely affect the breakdown voltage. To minimize detrimental effects, a lower average doping concentration and gradually decreased junction depth is provided at the edge. This is done by providing a couple narrow bands of n-type buried layer doping material adjacent to the edge of the principal portion of the buried layer 11. The location of the edge of the mask for the principal portion of the n-type buried layer is indicated by a [-shaped mark on FIG. 1 of the drawings.

Concentrically around the principal open area of the buried layer mask are two open bands 13 through which phosphorous is deposited. The physical process causing averaging and decreased average doping concentration at the edge of the buried layer 11 is the two-dimensional diffusion that takes place as a result of the narrow mask opening compared to the diffusion length. As diffusion from the bands 13 intersects and encounters diffusion of dopant from the main portion of the boundary layer, the vector of the concentration gradient is redirected, and a relatively gradual decrease in depth of the buried layer is obtained, having a larger radius of curvature than would be obtained by simply having a single hole in the buried layer mask and diffusion from the edge of that hole.

Dopant is then deposited for a p-type buried layer 16 in the region beneath the cathode 17 and gate 18 of the SCR. Dopant is also deposited for an auxiliary or barrier band 19 of p-type buried layer spaced apart from the principal p-type buried layer 16 and between the anode and gate. These two p-type buried layers have a relatively higher doping concentration and conductivity than the p-type substrate 10 for the device.

An n-type epitaxial layer 21 is deposited over the substrate and buried layers. The doping concentration is greater than that of the n-type buried layer 11 and the epitaxial layer is relatively thin, an exemplary thickness being about 13 micrometers. The disproportionate dimensions employed in the schematic drawings are exemplified when it is noted that the distance between the anode 12 and cathode 17 in a typical SCR as provided in practice of this invention is about 300 micrometers, while the thickness of the epitaxial layer is 13 micrometers. The diameter of the anode ring is about 200 micrometers.

A conventional p-type isolation layer 22 is diffused through the epitaxial layer 21 to the p-type buried layer 16 and is grounded for electrical isolation of the SCR.

The balance of the SCR is formed in the epitaxial layer adjacent to the device surface. An n-type buffer layer 23 and p-type emitter 24 are formed beneath the metal anode 12. Similarly, a p-type base 26 is formed for electrical contact with the gate 18 in the region above the principal p-type buried layer 16. An exemplary depth of the p-type base is in the order of 1.5 micrometers. A thin n-type emitter 27 is formed in the p-type base 26 for electrical contact with the metal cathode 17.

In these subsequent diffusions, the dopant for the p-type buried layers diffuses into the epitaxial layer 21 and the substrate 10 more or less as indicated in the drawings.

Although not directly a part of the SCR structure, a metal field plate 28 is deposited over the insulation adjacent to the inner edge of the p-type base layer 26 which forms the gate of the SCR. In the drawings, the field plate 28 is illustrated as a line apparently floating above the surface, since the electrical insulation on the surface of the device is deleted from the drawing for clarity, and only the electrically active elements of the device are illustrated.

At the same time the n-type buffer layer 23 is formed, a pair of protective bands 29 are formed in the epitaxial layer 21 between the anode and cathode. These bands are preferably formed in the portion of the epitaxial layer 21 overlying the n-type buried layer 11. They are near the junction at the anode 12 so that field shaping is near the location where breakdown may occur. The nearest band 29 is located within a region that has not become depleted at voltages just below those where breakdown would occur. For example, the inner band is about five micrometers from the buffer layer 23, and the outer band is spaced from the inner one by only about five micrometers. Each of the bands is about five micrometers wide.

These protective bands 29 and the n-type buffer layer 23 have a relatively higher doping concentration than the n-type epitaxial layer 21 and, hence, a higher conductivity. Thus, for example, in one embodiment the dopant density at the surface is about $10^{11}$ atoms per square centimeter and the protective bands 29 and buffer layer 23 are diffused to a junction depth of about three micrometers.

The n-type buffer layer 23 adjacent to the anode 12 is not as readily depleted as the epitaxial layer 21 and, in effect, terminates the electric field at a location away from the p-type emitter 24. The buffer layer 23 must have enough doping to terminate the electrical field to avoid punch-through breakdown between the substrate 10 and the emitter 24. On the other hand, the buffer layer has to have a sufficiently low concentration of doping to promote the injection efficiency of holes at the junction.

The lateral extent of the n-type buffer layer 23 (about 200 micrometers in an exemplary embodiment) may be determined by calculating the electric field distribution from a cylindrical approximation of the complex junction formed by the n-type buffer layer 23, n-type epitaxial layer 21, and n-type buried layer 11, with the p-type substrate 10, and iterating to minimize the geometrical field enhancement. Such an approximation produces a worst case (higher than expected) estimated field under the center portion of the anode 12, but indicates the electric field reasonably close to real values under the edges of the buffer layer 13.

Local high fields in this region are then reduced by the n-type protective bands 29 in a manner somewhat analogous to a field plate or guard ring, as hereinafter described. The protective bands 29 provide termination of the electric field that would otherwise terminate at the sides of the n-type buffer layer 23. In effect, the guard ring or rings divide the voltage drop from the anode region so that the principal voltage drop does not all occur near the junction.

Further from the anode 12 towards the gate 18 of the SCR the n-type buried layer 11 is not used, and there is only a relatively thin epitaxial layer 21 over the substrate. This thin epitaxial layer depletes clear through from the p-n junction to the surface of the semiconductor at about 400 volts. As the voltage is increased beyond this value, the electric field is forced to extend into the space above the semiconductor surface. This phenomenon has become known as the resurf principle.

Once the electric field is forced into the space above the surface, the vertical component (perpendicular to the semiconductor surface) of the electric vector increases very slowly with increasing voltage. As the lateral component of the electric field increases, the net electrical vector becomes more and more tilted, becoming almost parallel with the semiconductor surface.

In the region above the p-type buried layer 16 depletion occurs at much lower voltages than near the anode 12. The epitaxial layer 21 adjacent to the p-type buried layer 16 depletes through at about 35 to 40 volts. The electric field is forced away from the junctions and outside the silicon, and the SCR gate junction 18 is shielded from high fields. The field plate 28 used over the base-collector junction reduces the field in this area in a known manner.

The auxiliary band of p-type buried layer 19 spaced apart five to ten micrometers from the principal buried layer 16 also effects field shaping, which lowers the field at the edge of the principal p-type buried layer 16. The effect of the protective band 19 of p-type buried layer which is, in effect, in the more lightly doped p-type substrate 10, is analogous to the more highly doped protective bands 29 in the more lightly doped epitaxial layer 21.

As the voltage between the epitaxial layer 21 and the principal p-type buried layer 16 is increased, the depletion region spreads into the substrate 10, as indicated by the dashed line edges of the depletion region indicated at progressively higher voltages in FIGS. 2 and 3, for example. This depletion region spreading is distorted by the presence of the auxiliary band 19 of p-type buried layer, since the depletion region penetrates very little into the more highly doped, higher conductivity band 19.

With further increase of the voltage, the depletion region goes around the auxiliary band 19 as indicated in FIGS. 4 and 5 and cuts off the band from the substrate 10. At this point the electrical connection breaks between the auxiliary band 19 of the p-type buried layer and the substrate, and as the voltage further increases, the potential of the isolated band 19 also increases.

Operation of the auxiliary band 19 of the p-type buried layer is similar to an incomplete shield in that it limits the field that can go past it, but it does not completely stop the electric field. No reasonable estimation has been made for the field around the auxiliary band, although the field at the edge of the main p-type buried layer 16 can be estimated in the absence of the auxiliary band 19 of buried p-type material.

This can be done by breaking up the electric field to components having different origins. One component originates from the depleted epitaxial layer 21 above the p-type buried layer 16. A second component of the electric field originates from the depleted region of the epitaxial layer 21 between the cathode 17 and anode 12. A third component originates at the anode and increases linearly with increasing voltage above about 400 volts when the electric field is forced above the semiconductor surface. Only the portion above the depletion region belonging to the substrate 10 need be considered.

At lower voltages, maybe up to 100 volts, the region above the p-type buried layer 16 is almost completely depleted. The result is a nearly constant vertical field, since the field does not change much with increasing voltage. The depletion region above the substrate 10 in the epitaxial layer 21 is only a few micrometers thick, since most of the depletion region is in the more lightly doped substrate. Above this depletion region, there is another depletion region that is due to the edge of the p-type buried layer 16. As the voltage is increased, the depletion regions widen and the lateral field grows larger. However, when the epitaxial layer 21 is getting close to being fully depleted, the amount of charge available for terminating the field associated with the edge of the p-type buried layer 16 diminishes, and the lateral field component also decreases. By this means, the fields at the edge of the p-type buried layer can be kept small enough to avoid breakdown.

With further increase in voltage, the third component of the electric field originating from the anode 12 predominates, and the field at the edge of the p-type buried layer 16 is the vector sum of the anode field and the field of the depleted epitaxial layer 21 above the p-type buried layer. All that is required is that the anode-gate distance has to be large enough so that the field stays at safe levels to avoid breakdown.

A similar effect occurs at the protective bands 29 of conductive n-type material in the epitaxial layer 21 adjacent to the anode 12, except that the effects occur at higher voltages. As can be seen in FIGS. 6 and 7, for example, the depletion region reaches the surface of the epitaxial layer 21 at progressively shorter distances from the anode 12 as the voltage is increased. Eventually, as seen in FIG. 8, the depletion region reaches the surface of the semiconductor between the protective bands 29 and the innermost protective band adjacent to the n-type buffer layer 23. This electrically isolates the high conductivity protective bands 29 in an effect similar to that described with respect to the auxiliary band 19 of the p-type buried layer. In each of the bands isolated by surrounding depletion region, the voltage increases with increasing voltage, but at a lower rate than at the anode, for example.

The localized high field at the edge of the n-type buffer layer 23 is reduced by the shielding effect of the protective bands 29 in the epitaxial layer 21. These provide termination for the electric field that would otherwise terminate at the edge of the buffer layer. Addition of such protective bands 29 adjacent to the anode 12 of an SCR has increased the breakdown voltage of an exemplary embodiment from about 1600 volts to about 1900 volts. Optimizing the design should produce even greater increases in breakdown voltage.

It should be recognized that the n-type protective bands 29 and p-type buried layer auxiliary band 19 have common features. In each case, there is a band of material between the anode and cathode which has a higher doping concentration and higher conductivity than the adjacent material in which it is embedded. Further, it has the same polarity of doping as the more lightly doped semiconductor in which it is embedded. Thus, the n-type protective bands 29 have a higher doping concentration than the epitaxial layer 21 and the p-type buried layer band 19 has a higher doping concentration than the substrate 10. In each case, the higher conductivity band becomes isolated as the depletion region spreads with increasing voltage. Thus, the bands shape the electric field in the locale where electrical breakdown may commence and thereby retard electrical breakdown.

Although but one embodiment of semiconductor device has been described in detail herein, it will be apparent that the principles of this invention are applicable to other semiconductor devices such as diodes, bipolar transistors, MOSFETs and the like. Further, in this embodiment, one such band is illustrated adjacent to the p-type third layer and two bands are illustrated adjacent to the n-type buffer layer. It will be apparent that one, two or even three bands may be used for desired field shaping and optimization of breakdown voltage.

Further, only a single example of enhanced thickness of the epitaxial layer under the anode by way of the n-type buried layer has been mentioned. That structure may also be varied. This n-type buried layer, in effect, compensates for the thin, epitaxial layer required for the resurf principle to be operative remote from the anode. The thicker n-type material under the anode provides a greater thickness for the depletion region in this area. This permits use of a less costly, higher conductivity substrate than would be required without the n-type buried layer. Thus, instead of using a rather sensitive low conductivity substrate having a resistivity of about 400 to 500 ohm-centimeters, a relatively higher conductivity substrate with a resistivity of about 160 ohm-centimeters may be employed.

Other advantages, modifications, and variations of this invention will be appreciated by one skilled in the art. It is, therefore, to be understood that within the scope of the appended claims the invention may be practiced otherwise than as specifically described.

What is claimed is:

1. A high voltage semiconductor device comprising:
    a substrate;
    a sufficiently thin semiconductive layer on the substrate that a depletion region extends completely through the layer upon application of a sufficient voltage;
    electrode means for applying a voltage to the layer; and
    a buried layer having the same type doping as the semiconductive layer and relatively lighter doping than the semiconductive layer between a portion of the semiconductive layer and the substrate beneath the electrode means.

2. A semiconductor device as recited in claim 1, wherein the electrode means comprises a relatively heavier doped layer adjacent to a surface of the semiconductive layer which is opposite the substrate, the relatively heavier doped buffer layer having the same type doping as the semiconductive layer and means for making electrical contact with the buffer layer.

3. A semiconductor device as recited in claim 1 wherein the substrate is p-type material, and the semiconductive layer and buried layer are n-type material.

4. A semiconductor device resistant to breakdown upon application of a voltage comprising:
    at least a pair of electrical contacts to the semiconductor device;
    a relatively lighter doped region of one type of semiconductor extending substantially all of the way between the electrical contacts adjacent to the surface of the semiconductor device, the relatively lighter doped region being free of any of the other type of semiconductor between the electrical contacts;
    a p-n junction adjacent to only one of the electrical contacts; and
    a relatively heavier doped region of semiconductor with the same type doping as the lighter doped region located in the lighter doped region adjacent to the surface of the semiconductor device and extending less than all the way through the lighter doped region, the relatively heavier doped region being positioned adjacent only to the other electrical contact remote from the p-n junction for providing termination of an electric field that would otherwise terminate adjacent to the other electrical contact.

5. A high voltage semiconductor-controlled rectifier comprising:
    a p-type substrate;
    an n-type base formed on the substrate;
    a p-type emitter formed on the n-type base;
    an anode connected to the p-type emitter;
    a p-type base formed on the n-type base remote from the anode;
    an n-type emitter formed on the p-type base;
    a cathode connected to the n-type emitter;
    a gate electrode connected to the p-type base;
    a p-type buried layer between a portion of the n-type base and the substrate in an area under the p-type base; and
    a p-type buried band between a portion of the n-type base and the substrate between the p-type buried layer and the anode.

6. A semiconductor-controlled rectifier as recited in claim 5 further comprising a relatively thicker buried region of n-type base beneath the anode and a relatively thinner layer of n-type base more remote from the anode than the buried n-type region.

7. A semiconductor-controlled rectifier as recited in claim 6 wherein at least a portion of the thicker region of n-type base has a relatively lighter doping concentration than the thinner layer of n-type base.

8. A high voltage semiconductor-controlled rectifier comprising:
    a p-type substrate;
    an n-type base layer formed on the substrate;
    a p-type emitter formed on the n-type base;
    an anode connected to the p-type emitter;
    a p-type base formed on the n-type base remote from the anode;
    an n-type emitter formed on the p-type base;
    a cathode connected to the n-type emitter;
    a gate electrode connected to the p-type base; and
    a buried region of n-type material beneath the anode and beneath the layer of n-type base and having a relatively lighter doping concentration than the layer of n-type base.

9. A high voltage semiconductor-controlled rectifier comprising:
- a p-type substrate;
- a circular n-type base formed on the substrate; and in concentric annular rings:
- a p-type emitter formed on the n-type base;
- an anode connected to the p-type emitter;
- a p-type base formed on the n-type base remote from the anode;
- a gate electrode connected to the p-type base;
- an n-type emitter formed on the p-type base;
- a cathode connected to the n-type emitter;
- a ring of n-type semiconductor embedded in the n-type base between the anode and cathode adjacent to the anode, and having a higher doping concentration than the doping concentration of the n-type base;
- an annular p-type buried layer between the substrate and the n-type base beneath the p-type base; and
- an annular p-type buried ring between the substrate and the n-type base radially inward from the buried layer.

10. A high voltage semiconductor-controlled rectifier as recited in claim 9 further comprising a circular n-type buried layer between the substrate and the balance of the n-type base in at least an area beneath the p-type emitter and the ring of n-type semiconductor embedded in the n-type base, the n-type buried layer having a lower doping concentration than the n-type base.

* * * * *